(12) United States Patent
Sun

(10) Patent No.: US 7,902,552 B2
(45) Date of Patent: Mar. 8, 2011

(54) SEMICONDUCTOR DEVICE HAVING A RECESS CHANNEL STRUCTURE AND METHOD FOR MANUFACTURING THE SAME

(75) Inventor: Woo Kyung Sun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 215 days.

(21) Appl. No.: 11/757,328

(22) Filed: Jun. 1, 2007

(65) Prior Publication Data
US 2008/0048253 A1 Feb. 28, 2008

(30) Foreign Application Priority Data

Aug. 25, 2006 (KR) .................. 10-2006-0081278

(51) Int. Cl.
*H01L 27/108* (2006.01)
(52) U.S. Cl. ............ 257/68; 257/71; 257/296; 257/300; 257/302; 257/304; 257/E27.088
(58) Field of Classification Search .............. 257/306, 257/E27.088, 68, 71, 296, 300, 302, 304; 438/253
See application file for complete search history.

(56) References Cited

U.S. PATENT DOCUMENTS

| 6,465,831 B1 * | 10/2002 | Park et al. ............ 257/306 |
| 6,649,479 B2 * | 11/2003 | Park et al. ............ 438/279 |
| 7,045,846 B2 * | 5/2006 | Jang et al. ............ 257/306 |
| 7,423,318 B2 * | 9/2008 | Suh ................ 257/332 |
| 2003/0122171 A1 * | 7/2003 | Huang ............ 257/296 |

FOREIGN PATENT DOCUMENTS

| DE | 9933113 | * | 5/1998 |
| KR | 1020010017172 A | | 3/2001 |
| KR | 2002018874 | * | 3/2002 |
| KR | 2006003220 | * | 1/2006 |
| KR | 1020060010243 A | | 2/2006 |

* cited by examiner

*Primary Examiner* — Wai-Sing Louie
(74) *Attorney, Agent, or Firm* — Kilpatrick Townsend & Stockton LLP

(57) ABSTRACT

A semiconductor device includes a semiconductor substrate having an active region comprising a gate area, a bit line contact area and a storage node contact area. A recess is formed in the gate area and the bit line contact area. A gate is formed over the gate area and a portion of an isolation layer adjacent to the gate area. The gate includes a main gate in the gate area and a passing gate over the isolation layer. A first junction area is formed in the storage node contact area of the active region. A second junction area is formed in the bit line contact area of the active region. A first landing plug and a second landing plug are formed over the first junction area and the second junction area, respectively.

18 Claims, 7 Drawing Sheets

SEMICONDUCTOR DEVICE HAVING A RECESS CHANNEL STRUCTURE AND METHOD FOR MANUFACTURING THE SAME

CROSS-REFERENCE TO RELATED APPLICATIONS

The present application claims priority to Korean patent application number 10-2006-0081278 filed on Aug. 25, 2006, which is incorporated herein by reference in its entirety.

BACKGROUND OF THE INVENTION

The present invention relates to a semiconductor device having a recess channel structure, and more particularly, to a semiconductor device having a recess channel structure in which an adverse affect of a passing gate is reduced, and a method for manufacturing the same.

A reduction in channel length due to a semiconductor device design rule reduction causes a short channel effect in which a threshold voltage is lowered. As a result, an existing planar channel structure reaches a target threshold voltage limit of a transistor. To address this problem, a semiconductor device having a recess channel structure has an increased channel length compared to a semiconductor device having a planar channel structure.

A method for manufacturing a semiconductor device having a conventional recess channel structure will be described hereinafter with reference to attached drawings.

Referring to FIG. 1A, an isolation layer 102 for defining active regions having a gate forming area is formed over a semiconductor substrate 100. A recess mask 104 for exposing the gate forming area is formed over the semiconductor substrate 100 including the isolation layer 102. The recess mask 104 is formed to expose the gate area in the active region as well as a portion of the isolation layer 102 where a gate will pass. A recess 106 is formed by etching the gate area in the active region to a predetermined depth using the recess mask 104 as an etching barrier. The portion A of the isolation layer 102 where the gate will pass is etched to a depth that is less than the depth of the recess in the gate area.

Referring to FIG. 1B, the recess mask is removed. A gate insulation layer 110, a gate conductive layer 112 and a hard mask layer 116 are sequentially formed over the semiconductor substrate 100 including the recess 106. The hard mask layer 116, the gate conductive layer 112 and the gate insulation layer 110 are etched to form gates 120 and 122 over the recess 106. The gates 120 and 122 are formed to have a linear shape over the gate area of the active region formed with the recess 106 as well as the portion of the isolation layer 102 having an undesirably etched depth.

Hereinafter, the gate area of the active region (i.e., the gate 120 arranged over the recess 106) will be referred to as a main gate and the gate 122 arranged over the isolation layer 102 adjacent to the main gate will be referred to as a passing gate.

Source and drain areas 130 and 132 are respectively formed in a storage node contact area and a bit line contact area at both active regions of the main gate 120. A series of known follow up processes are sequentially performed, thereby completing formation of a semiconductor device having a recess channel structure.

In the semiconductor device having the conventional recess channel structure described above, a distance L, between the main gate 120 and the passing gate 122 becomes shortened as shown in FIG. 1B, as the isolation layer is etched when etching the gate forming area. Because the adverse affect of the passing gate 122 on the main gate 120 is increased as the distance L, between the main gate 120 and the passing gate 122 becomes shortened, a reduction in the threshold voltage and an increase in the leakage current in the main gate 120 results. The affect of the passing gate 122 becomes greater with the increased integration of a semiconductor device and should be addressed to improve the performance of a semiconductor device having a recess channel structure.

BRIEF SUMMARY OF THE INVENTION

Embodiments of the present invention are directed to a semiconductor device in which the adverse affect of a passing gate is reduced, and a method for manufacturing the same.

In one embodiment, a semiconductor device may include a semiconductor substrate having an active region comprising a gate area, a bit line contact area and a storage node contact area. A recess is formed in the gate area and the bit line contact area. A gate is formed over the gate area. The gate includes the recess and a portion of an isolation layer. The gate also includes a main gate in the gate area and a passing gate over the isolation layer. A first junction area is formed in the storage node contact area of the active region. A second junction area is formed in the bit line contact area of the active region. A first landing plug and a second landing plug are formed over the first junction area and the second junction area, respectively.

In one embodiment, the recess has a depth ranging from approximately 500 Å to approximately 3000 Å.

The main gate has a laminate structure of a gate insulation layer formed over a surface of the recess, a first gate conductive layer formed over the gate insulation layer to fill the recess, and a second gate conductive layer and a hard mask layer sequentially formed over the first gate conductive layer. Preferably, the first gate conductive layer is formed of a polysilicon layer and the second gate conductive layer is formed of a metal based layer.

The first junction area is formed proximate a side surface of the recess and the second junction area is positioned below the recess.

The semiconductor device may further include cell spacers positioned between the gate and the first landing plug, and between the gate and the second landing plug.

The semiconductor device may further include a gate spacer positioned between the gate and the cell spacer, and between the gate and the second landing plug. In one embodiment, the gate spacer has a thickness ranging from approximately 10 Å to approximately 500 Å.

In another embodiment, a method for manufacturing a semiconductor device may include forming an isolation layer defining an active region composed of a gate area, a bit line contact area and a storage node contact area in a semiconductor substrate. A recess is formed in the gate area and the bit line contact area. A gate material layer is formed to fill the recess. The gate material layer is first etched to expose the bit line contact area. A second junction area is formed in the exposed bit line contact area. The gate material layer is second etched to form a gate including a main gate in the gate area formed with the recess and a passing gate over the isolation layer. The second etching exposes the storage node contact area. A first junction area is formed in the exposed storage node contact area. A first landing plug and a second landing plug are formed over the first junction area and the second junction area, respectively.

The recess is formed to have a depth ranging from approximately 500 Å to approximately 3000 Å.

The method may further include, after forming the isolation layer and before forming the recess, forming a buffer insulation layer over the semiconductor substrate including the isolation layer. Well ion implantation and channel ion implantation are performed in the active region of the semiconductor substrate formed with the buffer insulation layer.

In one embodiment, the buffer insulation layer is formed to have a thickness ranging from approximately 10 Å to approximately 500 Å.

The main gate has a laminate structure of a gate insulation layer formed over a surface of the recess, a first gate conductive layer formed over the gate insulation layer to fill the recess, and a second gate conductive layer and a hard mask layer sequentially formed over the first gate conductive layer. Preferably, the first gate conductive layer is formed of a polysilicon layer and the second gate conductive layer is formed of a metal based layer.

The method may further include, after first etching the gate material layer and before forming the second junction area, forming an insulation layer for a gate spacer over the first etched gate material layer. In one embodiment, the insulation layer for a gate spacer is formed to have a thickness ranging from approximately 10 Å to approximately 500 Å.

In one embodiment, forming the second junction area is performed with an energy ranging from approximately 5 keV to approximately 500 keV.

In one embodiment, forming the first junction area is performed with an energy ranging from approximately 5 keV to approximately 500 keV.

The first junction area is formed proximate a side surface of the recess and the second junction area is formed below the recess.

The method may further include, after second etching the gate material layer and before forming the first junction area, forming a cell spacer.

DESCRIPTION OF SPECIFIC EMBODIMENTS

A preferred embodiment of the present invention is directed to a semiconductor device, in which when etching a gate area for obtaining a recess channel structure, the gate area is selectively etched by a change of a recess mask. Because undesirable etching of an isolation layer is prevented when etching the gate area, it is possible to prevent a decrease in space between a main gate in a gate area of an active region and a passing gate over the isolation layer.

In an embodiment of the present invention, since an acceptable distance can be maintained between the main gate and the passing gate, the adverse affect of the passing gate on the main gate can be minimized. Thus, operational characteristics of a semiconductor device having a recess channel structure can be improved.

Figure 1A:
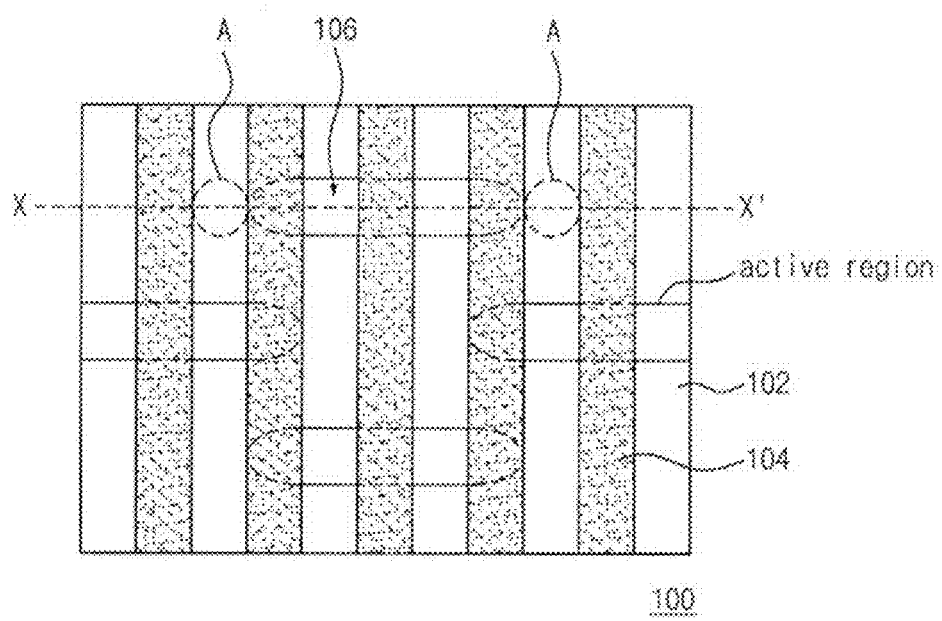
FIGS. 1A and 1B are cross-sectional views illustrating a procedure for manufacturing a semiconductor device having a conventional recess channel structure.
Figure 1A:
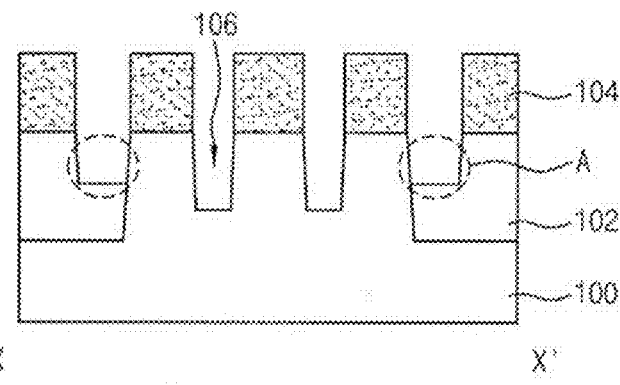
Figure 1B:
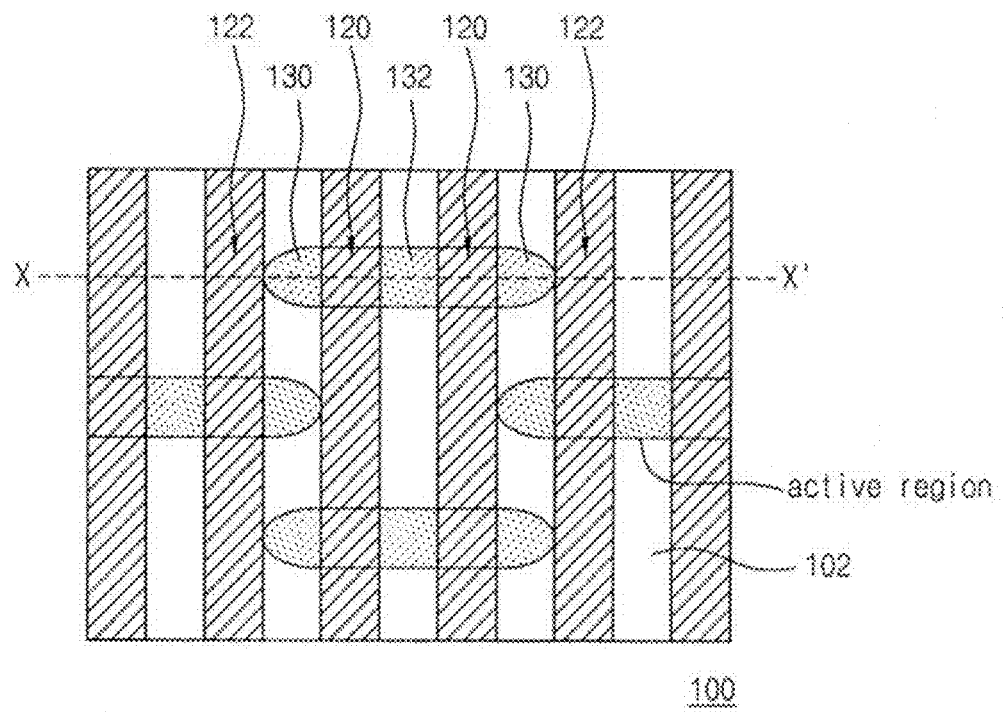
Figure 1B:
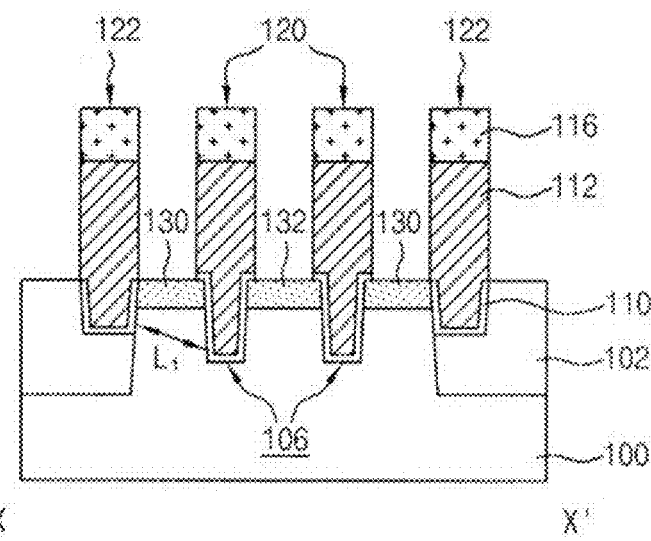
Figure 2A:
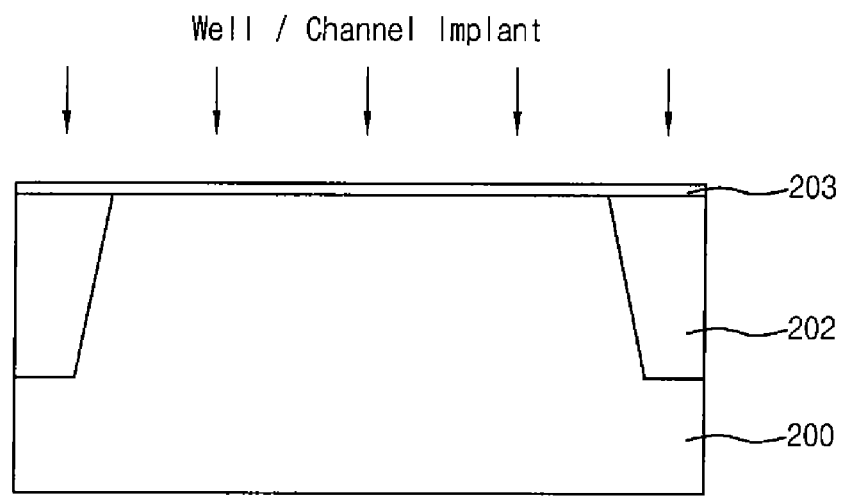
FIGS. 2A through 2H are cross-sectional views illustrating a procedure for manufacturing a semiconductor device having a recess channel structure in accordance with an embodiment of the present invention.
Figure 2B:
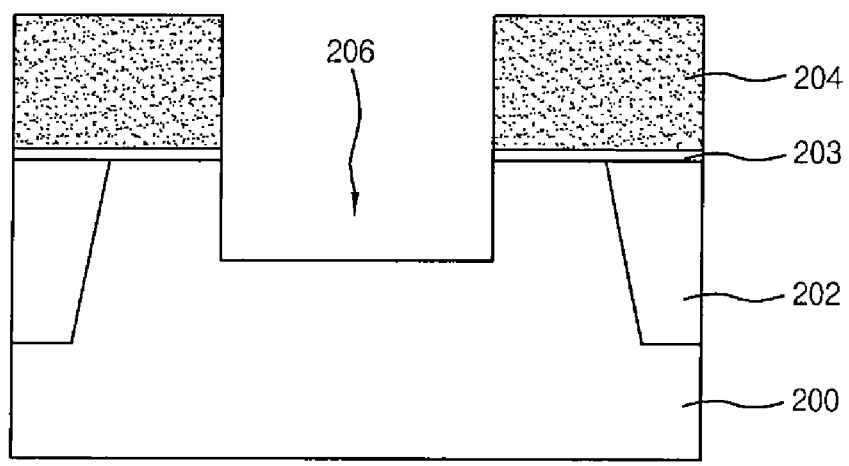
Figure 2C:
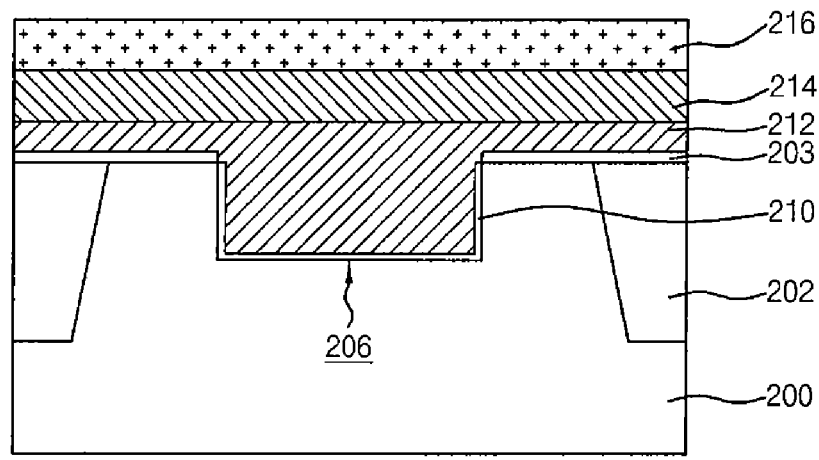
Figure 2D:
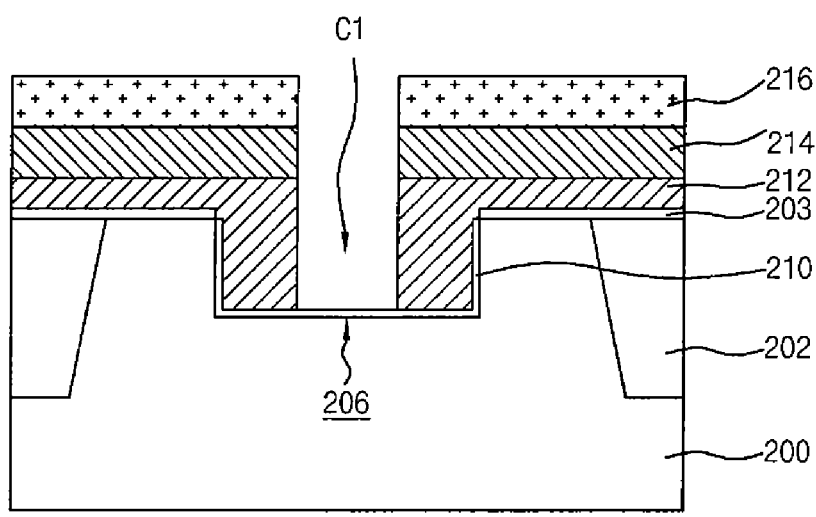
Figure 2E:
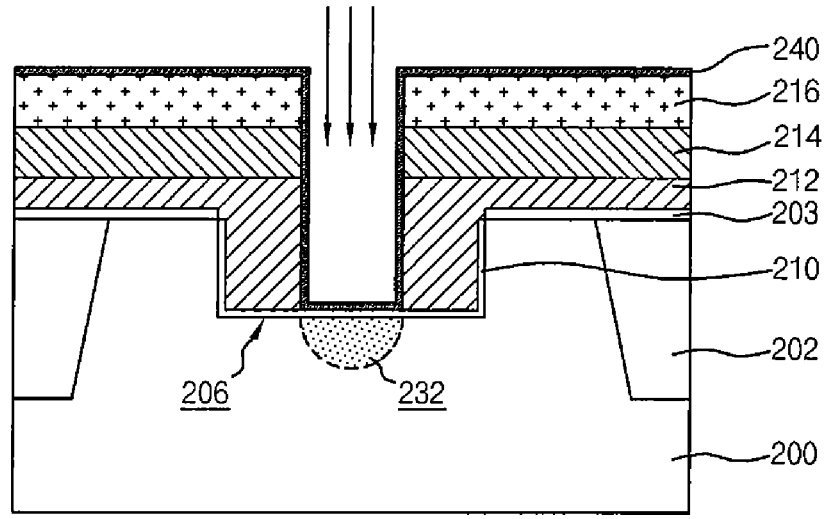
Figure 2F:
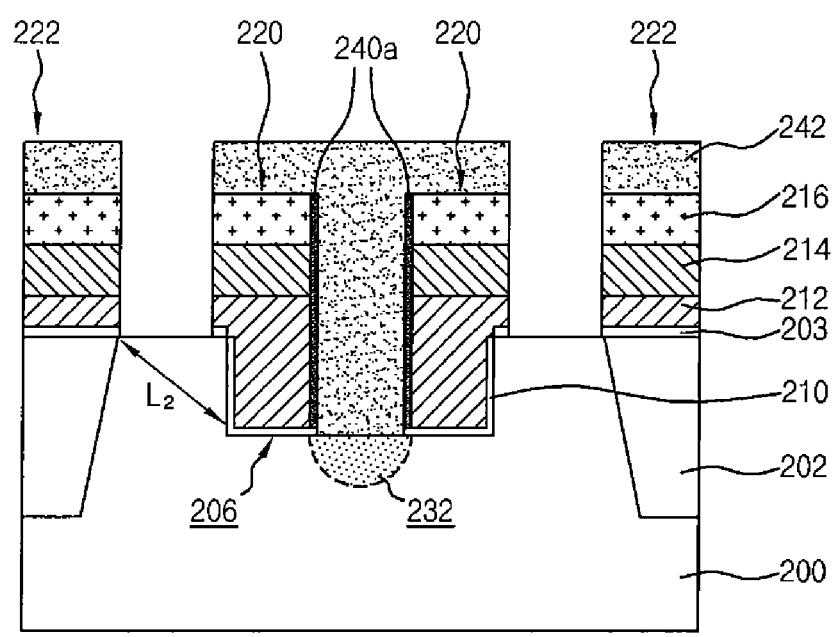
Figure 2G:
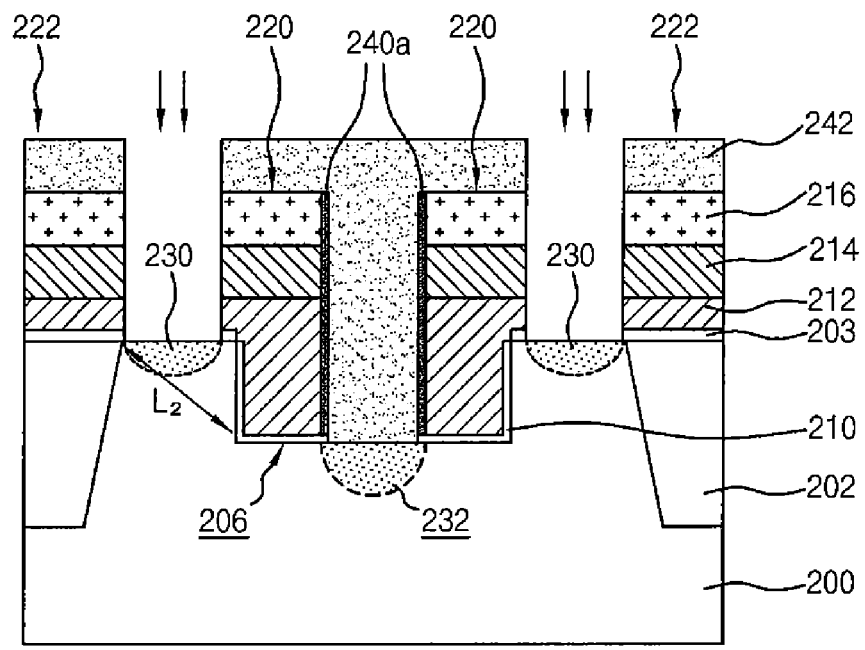
Figure 2H:
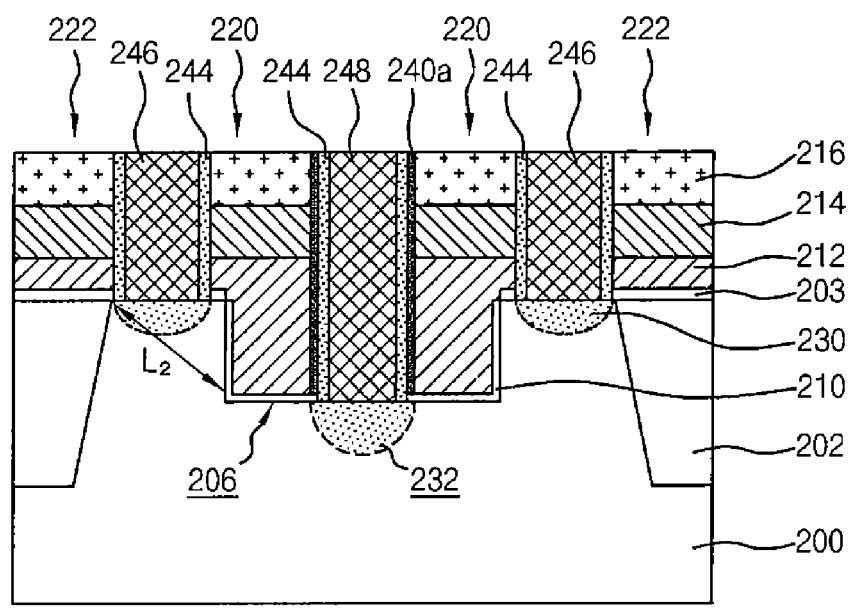

FIG. 2H is a cross-sectional view illustrating a semiconductor device having a recess channel structure in accordance with an embodiment of the present invention.

An isolation layer 202 defining active regions is formed in a semiconductor substrate 200. The active region includes a gate area, a storage node contact area and a bit line contact area. A recess 206 is formed in the gate area and the bit line contact area of the active region. A gate including a main gate 220 and a passing gate 222 is formed over the gate area formed with the recess 206 and the isolation layer 202 adjacent to the gate area.

A first junction area and a second junction area (i.e., a source area 230 and a drain area 232) are formed in the storage node contact area and the bit line contact area, respectively, at opposite sides of the main gate 220. The source area 230 is formed proximate a side surface of the recess 206, and the drain area 232 is formed below the recess 206. First and second landing plugs 246 and 248 are formed over the source and the drain areas 230 and 232, respectively. The second landing plug 248, including a portion which is formed in the recess 206, has a larger height than that of the first landing plug 246.

In the semiconductor device having a recess channel structure in accordance with the present invention, the portion of the isolation layer 202 in which the passing gate 222 is arranged is not subject to undesirable etching, unlike the conventional recess channel structure. Accordingly, because the passing gate 222 is positioned over the unetched isolation layer 202, a distance $L_2$ between the passing gate 222 and the main gate 220 is larger than in the conventional recess channel structure.

Because an acceptable distance is maintained between the main gate and the passing gate, it is possible to minimize the adverse affect of the passing gate and to improve the operational characteristics of the semiconductor device.

Hereinafter, a method for manufacturing a semiconductor device having a recess channel structure in accordance with an embodiment of the present invention will be described with reference to the attached drawings.

Referring to FIG. 2A, the isolation layer 202, which defines the active region including the gate area, storage node contact area and the bit line contact area, is formed in the semiconductor substrate 200. A buffer insulation layer 203 is formed to have a thickness ranging from approximately 10 Å to approximately 500 Å over the semiconductor substrate 200 including the isolation layer 202. Well ion implantation and channel ion implantation are sequentially performed in the active region formed with the buffer insulation layer 203.

Figure 3:
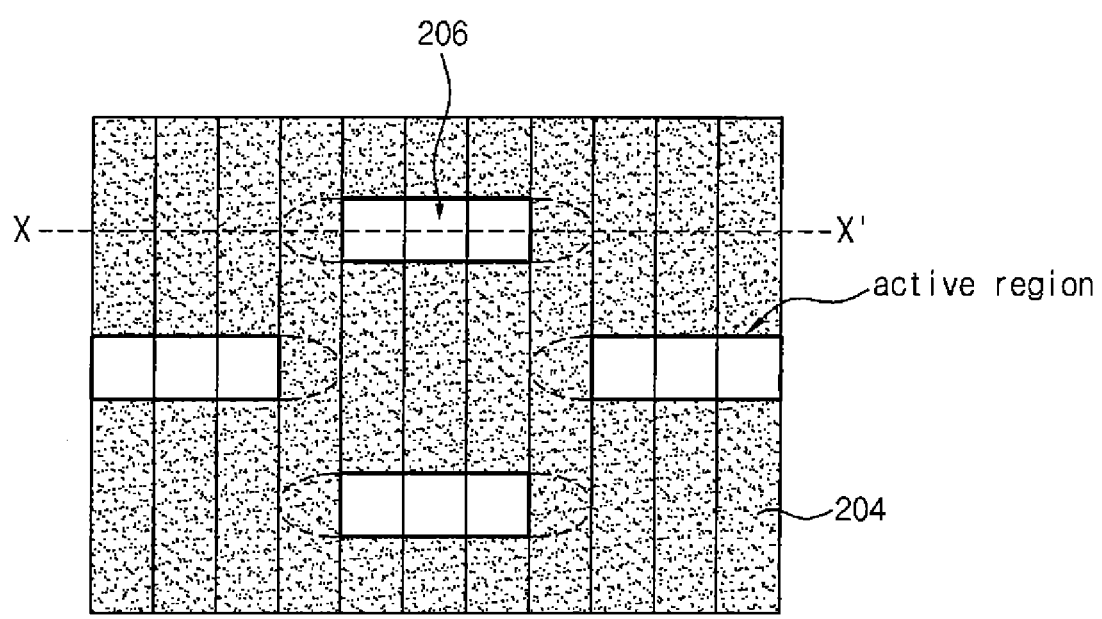
FIG. 3 is a plan view corresponding to FIG. 2B.

Referring to FIGS. 2B and 3, a recess mask 204 for exposing the gate area in the active region and the portion of the buffer insulation layer 203 in the bit line contact area is formed over the buffer insulation layer 203. In one embodiment, the recess mask 204 is formed by a photoresist layer.

Unlike the conventional recess mask which is formed to have a linear shape to expose the isolation layer 202 adjacent to the gate area, the recess mask 204 according to the present invention selectively exposes only the gate area of the active region and the bit line contact area, as shown in FIG. 3.

A recess 206 is formed by etching the exposed portion of the buffer insulation layer 203 and the gate area of the active region, and the bit line contact area below the exposed portion of the buffer insulation layer 203 using the recess mask 204 as an etching barrier. The recess 206 is preferably formed to have a depth ranging from approximately 500 Å to approximately 3000 Å. Because the etching for forming the recess 206 is performed selectively exposing only the gate area in the active region and the bit line contact area using the recess mask 204 as the etching barrier, it is possible to prevent etching a portion of the isolation layer 202 adjacent to the gate area (i.e., a portion of the isolation layer 202 in which a passing gate will be formed).

Referring to FIG. 2C, the recess mask 204 is removed using a known process, for example, an $O_2$ ashing process. A gate insulation layer 210, a first gate conductive layer 212, a second gate conductive layer 214 and a hard mask layer 216 are sequentially formed as a gate material layer over the semiconductor substrate 200 including the isolation layer 202. The gate insulation layer 210 is formed over a surface of the active region including a surface of the recess 206. In one embodiment, the first gate conductive layer 212 is formed of a polysilicon layer, and is vapor deposited to a thickness capable of filling the recess 206 over the gate insulation layer 210. The surface of the first gate conductive layer 212 is then planarized using a chemical mechanical polishing process. The second gate conductive layer 214 is formed of a metal based layer. The hard mask layer 216 is formed of a nitride layer.

Referring to FIG. 2D, a mask pattern (not shown) which exposes the bit line contact area over the hard mask layer 216 is formed. After etching the hard mask layer 216 using the mask pattern as an etching barrier, the second gate-conductive layer 214 and the first gate conductive layer 212 are etched using the hard mask layer 216 as an etching barrier, thereby forming a first contact hole C1 which exposes the bit line contact area. The mask pattern is then removed.

Referring to FIG. 2E, an insulation layer 240 for a gate spacer is formed to have a thickness ranging from approximately 10 Å to approximately 500 Å over the gate material layer including the first contact hole $C_1$. B, P, As or $BF_2$ ions are implanted into the bit line contact area in the active region through the first contact hole C1, thereby forming a second junction area (i.e., the drain area 232 in the bit line contact area). The ions are implanted with a lowered doping concentration relative to the first junction with an energy ranging from approximately 5 keV to approximately 500 keV.

In the present invention, as the bit line contact area is etched, a doping concentration in the bit line contact area can be lowered relative to the doping concentration in the storage node contact area formed thereafter. Accordingly, the present invention can prevent leakage current in the bit line contact area.

Referring to FIG. 2F, gate spacers 240a are formed over side walls of the first contact hole C1 by etching the insulation layer 240. A photoresist layer pattern 242 for exposing the storage node contact area is formed over the hard mask layer 216 of the gate material layer including the first contact hole C1. The etched gate material layer (i.e., the hard mask layer, the second gate conductive layer 214, the first gate conductive layer 212 and the gate insulation layer 210) is etched again to form a gate including the main gate 220 in the gate area of the active region and the passing gate 222 over the isolation layer 202. The etched gate material layer also exposes the storage node contact area of the active region.

In the present invention, loss of the isolation layer is prevented when etching the gate area to obtain the recess channel structure. The passing gate 222 is formed over the isolation layer 202 which is not etched. Accordingly, the distance $L_2$ between the main gate 220 and the passing gate 222 is larger than that in the conventional recess channel structure. Therefore, it is possible to minimize the adverse affect of the passing gate 222 on the main gate 220 and to stabilize the operational characteristics of the semiconductor device having the recess channel structure because the distance $L_2$ between the main gate 220 and the passing gate 222 is maintained at an acceptable value.

According to the present invention, it is possible to realize a desired micro line width without performing a photolithography process having the minimum line width when forming the gate, thereby realizing an increased integration.

Referring to FIG. 2G, B, P, As or $BF_2$ ions are implanted in the storage contact area of the exposed active region. The ions are implanted with an energy ranging from approximately 5 keV to approximately 500 keV. The implanted ions form a first junction area (i.e., the source area 230) in the bit line contact area. The source area 230 is formed proximate a side surface of the recess 206, whereas the drain area 232 is formed below the recess 206.

Referring to FIG. 2H, the photoresist layer pattern 242 is removed according to a known $O_2$ ashing process. After forming an insulation layer over the semiconductor substrate 200 including the main gate 220 and the passing gate 222, the insulation layer is etched to form a cell spacer 244 and a gate spacer 240a. The cell spacer 244 is formed over side walls of the main gate 220 and the passing gate 222 adjacent to the source area 230. The gate spacer 240a is formed over side walls of the main gate 220 adjacent to the drain area 232.

A conductive layer for a plug is formed over the semiconductor substrate 200 formed with the cell spacer 244 to fill the area between the gates. The conductive layer is then chemical mechanical polished until the hard mask layer 216 is exposed, thereby forming the first landing plug 246 over the source area 230 and the second landing plug 248 over the drain area 232. The second landing plug 248, including a portion which is formed in the recess 206, has a larger height than that of the first landing plug 246.

Though not shown, a series of known follow up processes are sequentially performed, thereby manufacturing a semiconductor device having the recess channel structure according to an embodiment of the present invention.

As is apparent from the above description, in an embodiment of the present invention, the bit line contact area is included when performing an etching process for lengthening a effective channel length of a transistor. In other words, an etching process is performed to form a recess and a gate area in the active region adjacent to the bit line contact area. Thus, loss of the isolation layer where the passing gate is formed can be prevented, thereby increasing the electrical distance between the main gate and the passing gate, and stabilizing the operational characteristics of the semiconductor device.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   a semiconductor substrate having an active region comprising a gate area, a bit line contact area and a storage node contact area, a recess being formed in the gate area and the bit line contact area;
   a gate formed over the gate area, wherein the gate comprises the recess and a portion of an isolation layer, the gate having a main gate in the gate area and a passing gate over the isolation layer,
   wherein the main gate comprises a laminate structure of a gate insulation layer formed over a surface of the recess, a first gate conductive layer formed over the gate insulation layer to fill the recess, and a second gate conductive layer and a hard mask layer sequentially formed over the first gate conductive layer, and wherein the passing gate comprises a laminate structure of a buffer insulation layer, a first gate conductive layer, a second gate conductive layer and a hard mask layer sequentially formed over a surface of the isolation layer;

a first junction area formed in the storage node contact area of the semiconductor substrate;

a second junction area formed in the bit line contact area of the semiconductor substrate, wherein the second junction area formed in the bit line contact area has a lower doping concentration relative to the first junction area formed in the storage node contact area, the lower doping concentration of the second junction area preventing leakage current in the bit line contact area; and a first landing plug and a second landing plug formed over the first junction area and the second junction area, respectively.

2. The semiconductor device according to claim 1, wherein the recess has a depth ranging from approximately 500Å to approximately 3000 Å.

3. The semiconductor device according to claim 1, wherein the first gate conductive layer is formed of a polysilicon layer and the second gate conductive layer is formed of a metal based layer.

4. The semiconductor device according to claim 1, wherein the first junction area is formed proximate a side surface of the recess and the second junction area is formed below the recess.

5. The semiconductor device according to claim 1, further comprising cell spacers positioned between the gate and the first landing plug, and between the gate and the second landing plug.

6. The semiconductor device according to claim 5, further comprising a gate spacer positioned between the gate and the cell spacer, and between the gate and the second landing plug.

7. The semiconductor device according to claim 6, wherein the gate spacer has a thickness ranging from approximately 10Å to approximately 500 Å.

8. A method for manufacturing a semiconductor device, the method comprising:

forming an isolation layer defining an active region comprising a gate area, a bit line contact area and a storage node contact area in a semiconductor substrate;

forming a buffer insulation layer over the semiconductor substrate including the isolation layer;

performing well ion implantation and channel ion implantation in the active region of the semiconductor substrate formed with the buffer insulation layer;

forming a recess in the gate area and the bit line contact area;

forming a gate material layer to fill the recess;

first etching the gate material layer to expose the hit line contact area:

forming a second junction area in the bit line contact area of the semiconductor substrate;

second etching the gate material layer to form a gate including a main gate in the gate area formed with the recess and a passing gate over the isolation layer, wherein the second etching exposes the storage node contact area;

forming a first junction area in the storage node contact area of the semiconductor substrate, wherein the second junction area formed in the bit line contact area has a lower doping concentration relative to the first junction area formed in the storage node contact area, the lower doping concentration of the second junction area preventing leakage current in the hit line contact area; and forming a first landing plug and a second landing plug over the first junction area and the second junction area, respectively.

9. The method for manufacturing a semiconductor device according to claim 8, wherein the buffer insulation layer is formed to a thickness ranging from approximately 10Å to approximately 500 Å.

10. The method for manufacturing a semiconductor device according to claim 8, wherein the recess is formed to a depth of approximately 500Å to approximately 3000 Å.

11. The method for manufacturing a semiconductor device according to claim 8, wherein the main gate has a laminate structure comprising a gate insulation layer formed over a surface of the recess, a first gate conductive layer formed over the gate insulation layer to fill the recess, and a second gate conductive layer and a hard mask layer sequentially formed over the first gate conductive layer.

12. The method for manufacturing a semiconductor device according to claim 11, wherein the first gate conductive layer is formed of a polysilicon layer and the second gate conductive layer is formed of a metal based layer.

13. The method for manufacturing a semiconductor device according to claim 8, further comprising, after first etching the gate material layer and before forming the second junction area, forming an insulation layer for a gate spacer over the first etched gate material layer.

14. The method for manufacturing a semiconductor device according to claim 13, wherein the insulation layer is formed to have a thickness ranging from approximately 10Å to approximately 500 Å.

15. The method for manufacturing a semiconductor device according to claim 8, wherein forming the second junction area is performed with an energy ranging from approximately 5 keV to approximately 500 keV.

16. The method for manufacturing a semiconductor device according to claim 8, wherein forming the first junction area is performed with an energy ranging from approximately 5 keV to approximately 500 keV.

17. The method for manufacturing a semiconductor device according to claim 8, wherein the first junction area is formed proximate a side surface of the recess and the second junction area is formed below the recess.

18. The method for manufacturing a semiconductor device according to claim 8, further comprising, after second etching the gate material layer and before forming the first junction area, forming a cell spacer.

* * * * *